(12) United States Patent
Chen et al.

(10) Patent No.: US 12,336,326 B2
(45) Date of Patent: Jun. 17, 2025

(54) METHOD OF MANUFACTURING MICRO DEVICES

(71) Applicant: MIKRO MESA TECHNOLOGY CO., LTD., Apia (WS)

(72) Inventors: Li-Yi Chen, Tainan (TW); Hsiao-Fu Lu, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 478 days.

(21) Appl. No.: 17/806,499

(22) Filed: Jun. 12, 2022

(65) Prior Publication Data
US 2023/0402565 A1    Dec. 14, 2023

(51) Int. Cl.
*H10H 20/01* (2025.01)

(52) U.S. Cl.
CPC ........ *H10H 20/0137* (2025.01); *H10H 20/01* (2025.01)

(58) Field of Classification Search
CPC ............. H01L 33/0075; H01L 33/0095; H01L 21/30621; H01L 21/3085; H01L 33/0093; H01L 33/0062; H01L 21/3065; H01L 21/3083
See application file for complete search history.

(56) References Cited

U.S. PATENT DOCUMENTS

2021/0050476 A1* 2/2021 Benaissa ............. H01L 33/0095
2023/0187591 A1* 6/2023 Tan ........................ H01L 33/10
                                                              257/79

FOREIGN PATENT DOCUMENTS

CN    105609596 A  *  5/2016  ......... H01L 33/0075
TW    202036793 A    10/2020

OTHER PUBLICATIONS

Tahhan et al, "Optimization of a chlorine-based deep vertical etch of GaN demonstrating low damage and low roughness", J. Vac. Sci. Technol. A 34, 031303 (2016) (Year: 2016).*
Zhou et al, "Dry etching characteristics of GaN using Cl2/BCl3 inductively coupled plasmas", Appl. Surf. Sci. 257, 905-910 (2010) (Year: 2010).*
Espacenet translation of CN-105609596-A (Year: 2016).*
Jung et al, "Inductively coupled plasma etching of SiO2 layers for planar lightwave circuits", Thin Solid Films 341 (1999); pp. 188-191 (Year: 1999).*

* cited by examiner

*Primary Examiner* — Zandra V Smith
*Assistant Examiner* — Corbyn D Mellinger
(74) *Attorney, Agent, or Firm* — CKC & Partners Co., LLC

(57) ABSTRACT

A method of manufacturing micro devices includes: preparing a GaN-based epitaxial structure including a p-type GaN layer, a n-type GaN layer on the p-type GaN layer, and an undoped GaN layer on the n-type GaN layer; forming a photoresist layer on the GaN-based epitaxial structure with the undoped GaN layer contacting the photoresist layer; patterning the photoresist layer; performing a plasma etching process to the GaN-based epitaxial structure through the patterned photoresist layer until the patterned photoresist layer is completely removed, such that a plurality of mesas are formed on the etched GaN-based epitaxial structure, in which a height of the mesas is at least 1.0 μm; and continuing to perform the plasma etching process until the undoped GaN layer is completely removed and the etched GaN-based epitaxial structure is cut into a plurality of micro devices.

14 Claims, 7 Drawing Sheets

METHOD OF MANUFACTURING MICRO DEVICES

BACKGROUND

Field of Invention

The present disclosure relates to a method of manufacturing micro devices.

Description of Related Art

The statements in this section merely provide background information related to the present disclosure and do not necessarily constitute prior art.

As a light source, light-emitting diodes (LEDs) have many advantages, including low energy consumption, long lifetime, small size, and fast switching. Hence, conventional lighting, such as incandescent lighting, is gradually replaced by LED lights. The properties regarding LEDs also fit applications on displays. Researches on displays using micro light-emitting devices, or specifically, micro light-emitting diodes (micro LEDs), have become popular in recent years. Commercial lighting applications made of micro LEDs are nearly within reach.

During the fabrication of micro LEDs, a photoresist layer is usually used as a mask, and the photoresist layer is removed by a photoresist removal process after the micro LEDs are fabricated. The chemical substances produced in the photoresist removal process mainly include water, residual photoresist stripper, photoresist, and other substances produced after the reaction, which cause a lot of burden to the environment. The components of conventional photoresist strippers are usually quite complex, and most of them are composed of four to six kinds of chemical substances, so it is very difficult to recycle and difficult to achieve reasonable economic benefits.

SUMMARY

According to some embodiments of the present disclosure, a method of manufacturing micro devices is provided. The method includes: preparing a GaN-based epitaxial structure attached on a substrate, the GaN-based epitaxial structure including a p-type GaN layer, a n-type GaN layer on the p-type GaN layer, and an undoped GaN layer on the n-type GaN layer; forming a photoresist layer on the GaN-based epitaxial structure with the undoped GaN layer contacting the photoresist layer; patterning the photoresist layer to expose portions of the undoped GaN layer; performing a plasma etching process to the GaN-based epitaxial structure through the patterned photoresist layer until the patterned photoresist layer is completely removed, such that a plurality of mesas are formed on the etched GaN-based epitaxial structure, in which a height of the mesas is at least 1.0 μm; and continuing to perform the plasma etching process until the undoped GaN layer is completely removed to expose the n-type GaN layer and the etched GaN-based epitaxial structure is cut into a plurality of micro devices.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
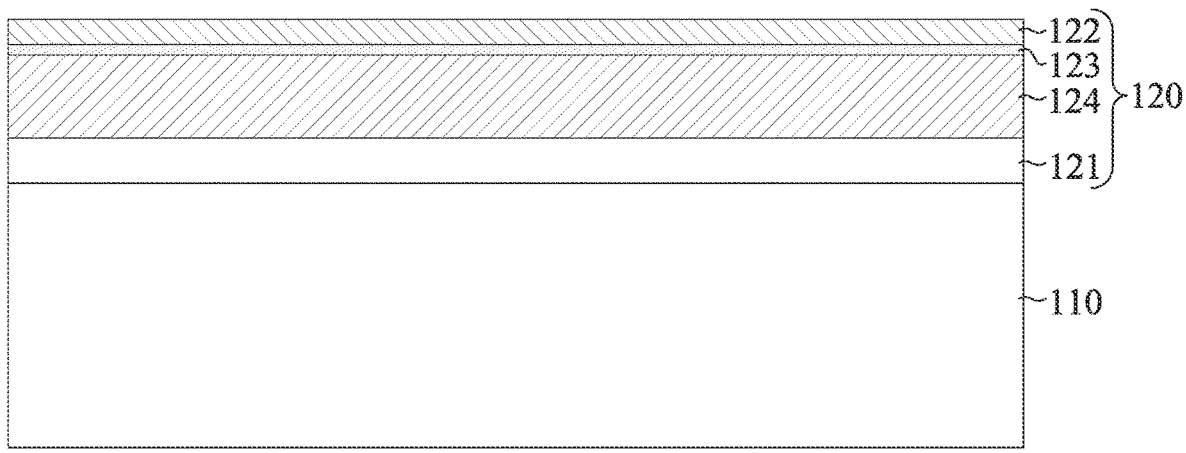
FIG. 1 is a schematic cross-sectional view of an intermediate stage of a method of manufacturing micro devices according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

The terms "micro" device, "micro" p-n diode or "micro" LED as used herein may refer to the descriptive size of certain devices or structures according to embodiments of the present disclosure. As used herein, the terms "micro" devices or structures may be meant to refer to the scale of 1 to 100 µm. However, it is to be appreciated that embodiments of the present disclosure are not necessarily so limited, and that certain aspects of the embodiments may be applicable to larger, and possibly smaller size scales.

Embodiments of the present disclosure describe a method of forming micro devices such as micro light-emitting diodes (micro LEDs) on a substrate. The substrate may be a carrier substrate or a receiving substrate. For example, the receiving substrate may be, but is not limited to, a display substrate.

Reference is made to FIG. 1. FIG. 1 is a schematic cross-sectional view of an intermediate stage of a method of manufacturing micro devices according to some embodiments of the present disclosure. As shown in FIG. 1, a GaN-based epitaxial structure 120 is formed on a growth substrate 110. The GaN-based epitaxial structure 120 is formed of GaN (Gallium nitride). The GaN-based epitaxial structure 120 may not be fully functional. For example, contacts such as an anode or cathode may not yet be formed. In the interest of conciseness and to not obscure embodiments of the present disclosure, the following description is made with regard to the GaN-based epitaxial structure 120 as a GaN p-n diode layer grown on the growth substrate 110 according to conventional heterogeneous growth conditions.

In some embodiments, the growth substrate 110 may include any suitable substrate such as, but not limited to, silicon, SiC, GaAs, GaN and sapphire (Al2O3).

For example, in some embodiments, the growth substrate 110 is sapphire. Despite the fact that sapphire has a larger lattice constant and thermal expansion coefficient mismatch with respect to GaN, sapphire is still reasonably low cost, widely available and its transparency is compatible with laser lift-off (LLO) techniques. In some other embodiments, another material such as SiC may be used as the growth substrate 110 for the GaN-based epitaxial structure 120. Like sapphire, SiC substrates may be transparent. Several growth techniques may be used for growth of the GaN-based epitaxial structure 120 such as metalorganic chemical vapor deposition (MOCVD).

As shown in FIG. 1, the GaN-based epitaxial structure 120 may include a p-type GaN layer 122, an active layer 123, an n-type GaN layer 124, and an undoped GaN layer 121. In some embodiments, the n-type GaN layer 124 may be doped with a donor such as silicon, while p-type GaN layer 122 may be doped with an acceptor such as magnesium. A variety of alternative p-n diode configurations may be utilized to form the GaN-based epitaxial structure 120. Likewise, a simple p-n contact junction or a variety of single quantum well (SQW) or multiple quantum well (MQW) configurations may be utilized to form the active layer 123. In addition, various buffer layers may be included as appropriate.

In some embodiments, the growth substrate 110 may have a thickness in a range from 100 µm to 400 µm. In some embodiments, the undoped GaN layer 121 may have a thickness in a range from 3 µm to 5 µm. In some embodiments, the n-type GaN layer 124 may have a thickness in a range from 0.1 µm to 5 µm. In some embodiments, the active layer 123 may have a thickness in a range from 100 nm to 400 nm. In some embodiments, the p-type GaN layer 122 may have a thickness in a range from 100 nm to 1 µm.

Figure 2:
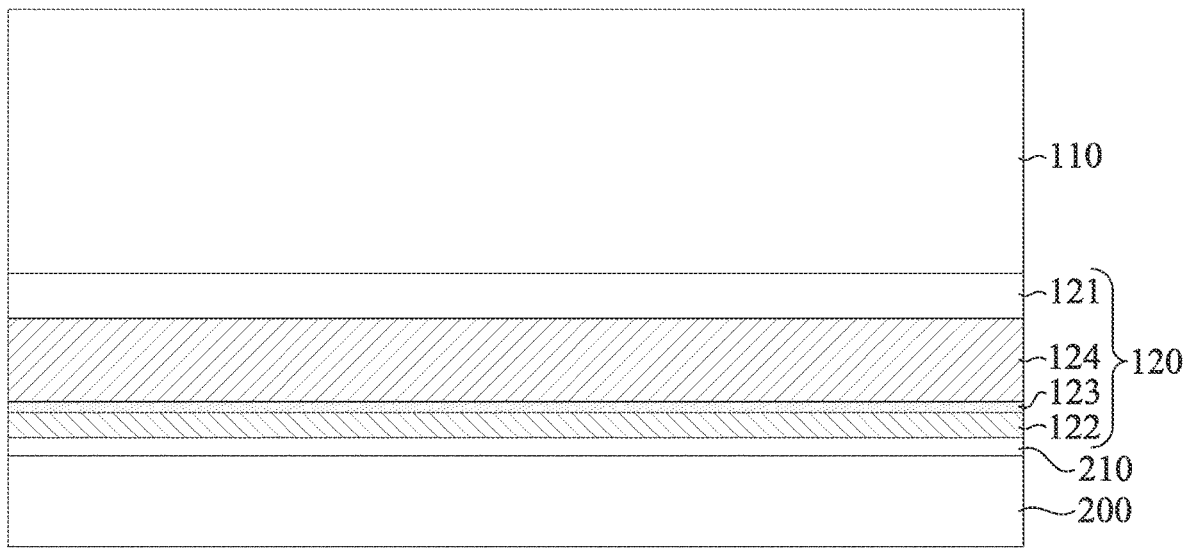
FIG. 2 is a schematic cross-sectional view of an intermediate stage of the method of manufacturing micro devices according to some embodiments of the present disclosure.

Reference is made to FIG. 2. FIG. 2 is a schematic cross-sectional view of an intermediate stage of the method of manufacturing micro devices according to some embodiments of the present disclosure. As shown in FIG. 2, a combination of the GaN-based epitaxial structure 120 and the growth substrate 110 is transferred to a substrate 200 with a metal layer 210 provided thereon (i.e., the substrate 200 is a receiving substrate). Specifically, after the combination is transferred to the substrate 200, the GaN-based epitaxial structure 120 is placed on the metal layer 210 with the p-type GaN layer 122 contacting the metal layer 210.

Figure 3:
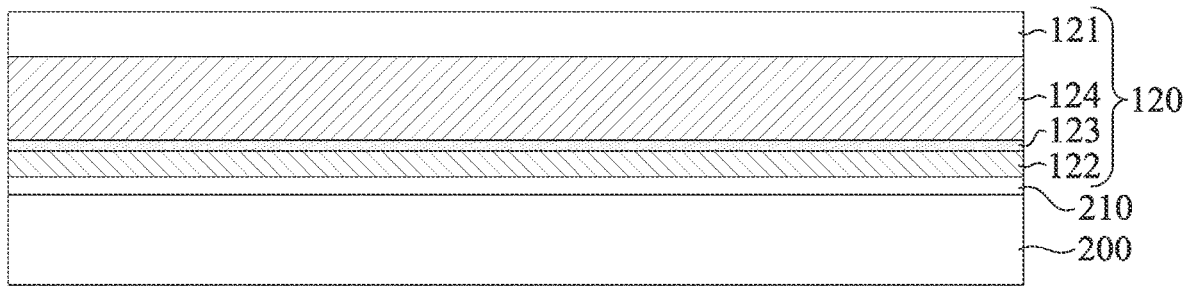
FIG. 3 is a schematic cross-sectional view of an intermediate stage of the method of manufacturing micro devices according to some embodiments of the present disclosure.

Reference is made to FIG. 3. FIG. 3 is a schematic cross-sectional view of an intermediate stage of the method of manufacturing micro devices according to some embodiments of the present disclosure. As shown in FIG. 3, the growth substrate 110 is removed from the GaN-based epitaxial structure 120. The growth substrate 110 may be removed by a suitable method such as chemical lift-off or laser lift-off (LLO).

Figure 4:
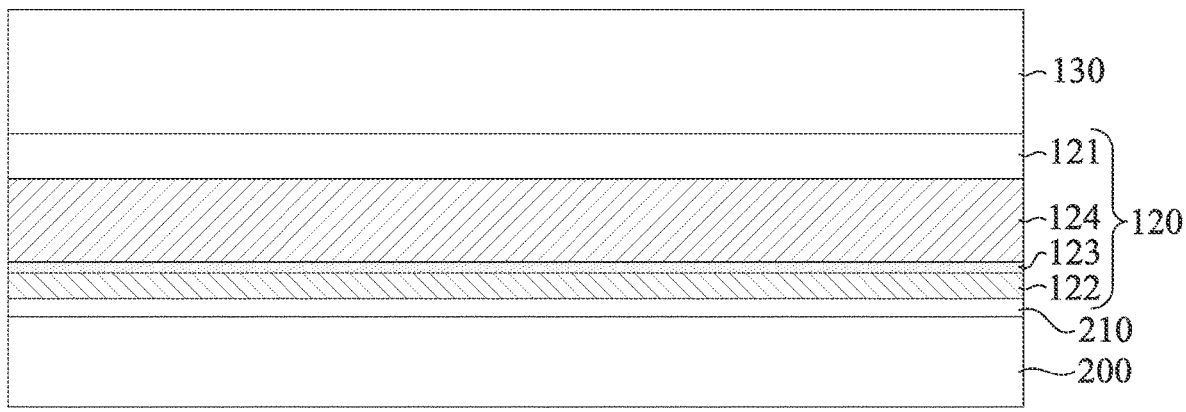
FIG. 4 is a schematic cross-sectional view of an intermediate stage of the method of manufacturing micro devices according to some embodiments of the present disclosure.

Reference is made to FIG. 4. FIG. 4 is a schematic cross-sectional view of an intermediate stage of the method of manufacturing micro devices according to some embodiments of the present disclosure. As shown in FIG. 4, a photoresist layer 130 is formed on the GaN-based epitaxial structure 120 with the undoped GaN layer 121 contacting the photoresist layer 130. In some embodiments, a thickness of the photoresist layer 130 is in a range from 2 µm to 8 µm.

Figure 5:
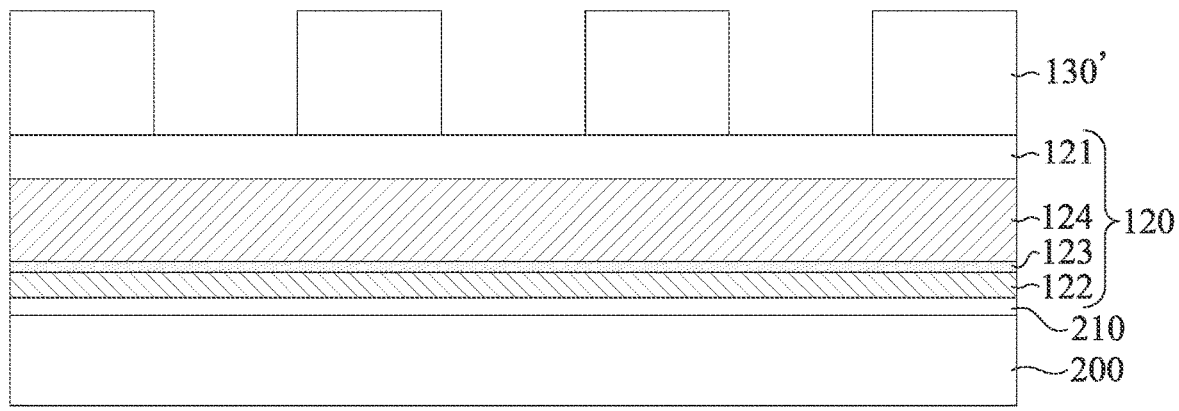
FIG. 5 is a schematic cross-sectional view of an intermediate stage of the method of manufacturing micro devices according to some embodiments of the present disclosure.

Reference is made to FIG. 5. FIG. 5 is a schematic cross-sectional view of an intermediate stage of the method of manufacturing micro devices according to some embodiments of the present disclosure. As shown in FIG. 5, the photoresist layer 130 is patterned. In some embodiments, the patterned photoresist layer 130' exposes some portions of the undoped GaN layer 121. In some other embodiments, the patterned photoresist layer 130' may have recesses on a side of the patterned photoresist layer 130' and extending toward the GaN-based epitaxial structure 120 without reaching the undoped GaN layer 121.

Figure 6:
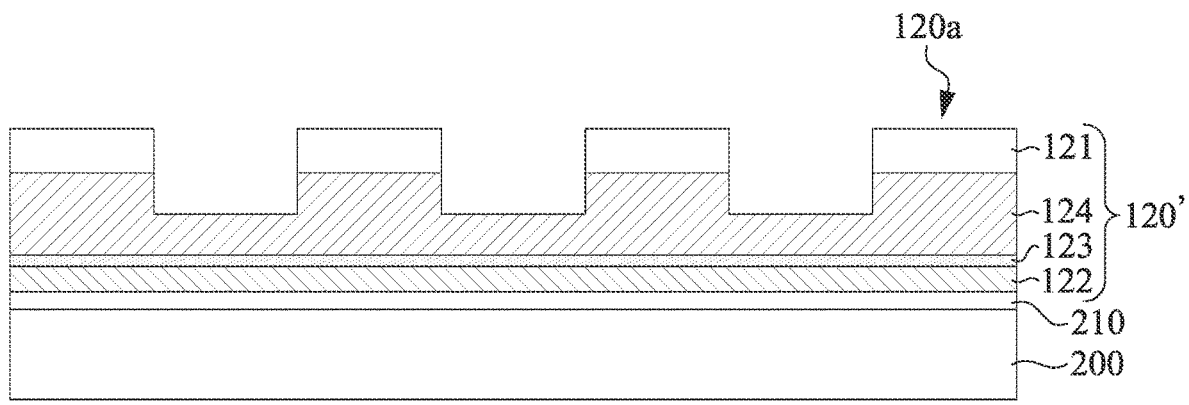
FIG. 6 is a schematic cross-sectional view of an intermediate stage of the method of manufacturing micro devices according to some embodiments of the present disclosure.

Reference is made to FIG. 6. FIG. 6 is a schematic cross-sectional view of an intermediate stage of the method of manufacturing micro devices according to some embodiments of the present disclosure. As shown in FIG. 6, a plasma etching process is performed to the GaN-based epitaxial structure 120 through the patterned photoresist layer 130' until the patterned photoresist layer 130' is completely removed, such that a plurality of mesas 120a are formed on the etched GaN-based epitaxial structure 120'. In some embodiments, a height of the mesas 120a is at least 1.0 µm. In some embodiments, as shown in FIG. 6, the n-type GaN layer 124 is etched without being etched through to expose the active layer 123, so that the mesas 120a consist of the etched undoped GaN layer 121 and the etched n-type GaN layer 124, and the height of the mesas 120a is smaller than a distance between a top surface of the etched undoped GaN layer 121 and a top surface of the active layer 123, but the disclosure is not limited in this regard.

In some embodiments, an etch selectivity of the GaN-based epitaxial structure 120 and the photoresist layer 130 relative to the plasma etching process is in a range from 1.5 to 0.3, but the disclosure is not limited in this regard. The etch selectivity refers to the etch depth of the GaN-based epitaxial structure 120 that can be exchanged for consuming a unit thickness of the photoresist layer 130.

For example, in some embodiments, the etch selectivity of the GaN-based epitaxial structure 120 and the photoresist layer 130 relative to the plasma etching process is in a range from 1 to 0.5, and the thickness of the photoresist layer 130 is in a range from 3 μm to 7 μm. With the configurations, the mesas 120a with the height in the range from 1.5 μm to 5.0 μm can be obtained after the photoresist layer 130 is completely removed by the plasma etching process. In addition, the mesas 120a with a height greater than 1.5 μm may allow the micro devices 120" (referring to FIG. 7) subsequently formed have a larger height. For example, a height of the micro devices 120" may be greater than 1.0 μm. Not only that, the mesas 120a with a height greater than 1.5 μm may further allow the etching surface (i.e., a top surface of the etched GaN-based epitaxial structure 120') during the plasma etching process to be farther away from the active layer 123, so as to increase the protection effect of the overlying layer (i.e., the n-type GaN layer 124) on the active layer 123.

It should be pointed out that if the thickness of the photoresist layer 130 is too small (e.g., less than 2 μm), the mesas 120a with a height greater than 1.0 um may not be produced. In addition, if the thickness of the photoresist layer 130 is too large (e.g., greater than 8 μm), the profile of the mesas 120a during etching may be difficult to be controlled.

as mentioned above, a thickness of the photoresist layer 130 is in a range from 2 μm to 8 μm.

In some embodiments, the plasma etching process includes an ICP-RIE etching process, but the disclosure is not limited in this regard. In some embodiments, a height of the mesas 120a is at least 1.0 μm.

In some embodiments, an etching gas used in the plasma etching process may include at least one of Cl2, SF6, NF3, Br2, I2, and BCl3. In some embodiments, in order to flexibly adjust the etching rate and reduce the defect, the etching gas may further include at least one of Ar, N2, and O2.

In some embodiments, the etch selectivity may be changed by flexibly adjusting at least one of the radio frequency (RF) power of the ICP-RIE etching process, the DC bias, or types of etching gases.

Figure 6A:
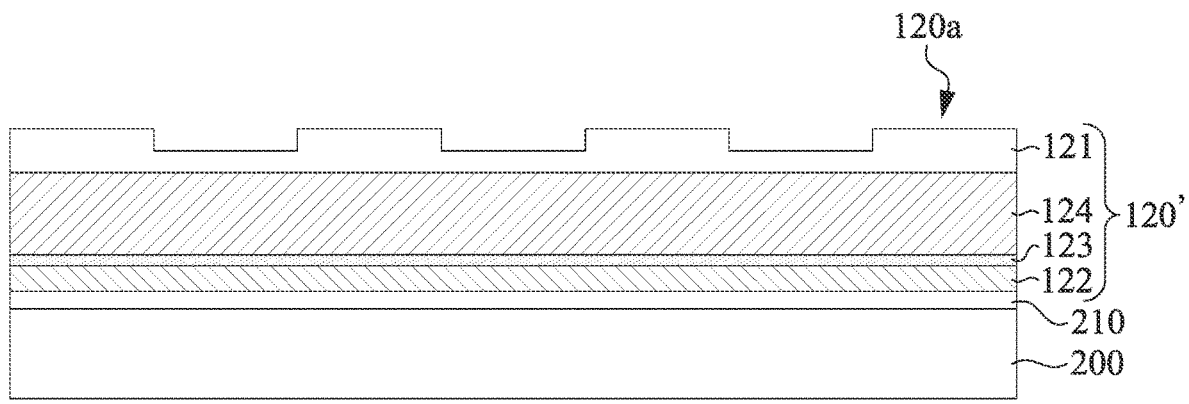
FIG. 6A is a schematic cross-sectional view of an intermediate stage of the method of manufacturing micro devices according to some embodiments of the present disclosure.

Reference is made to FIG. 6A. FIG. 6A is a schematic cross-sectional view of an intermediate stage of the method of manufacturing micro devices according to some embodiments of the present disclosure. In some embodiments, as shown in FIG. 6A, after the plasma etching process is performed until the patterned photoresist layer 130' is completely removed, the undoped GaN layer 121 is etched without being etched through to expose the n-type GaN layer 124, so that the mesas 120a consist of the etched undoped GaN layer 121, and the height of the mesas 120a is smaller than a thickness of the undoped GaN layer 121.

Figure 7:
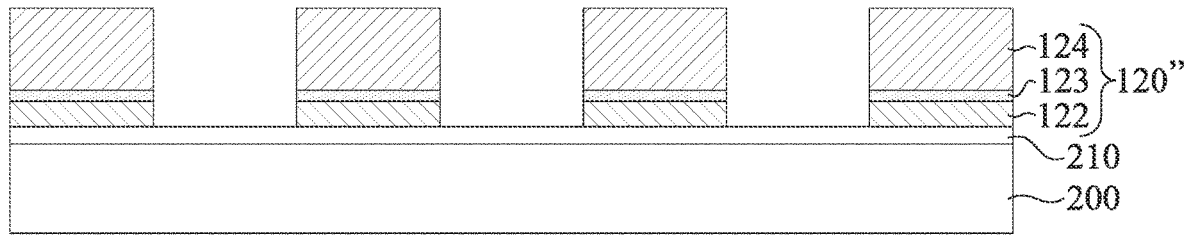
FIG. 7 is a schematic cross-sectional view of an intermediate stage of the method of manufacturing micro devices according to some embodiments of the present disclosure.

Reference is made to FIG. 7. FIG. 7 is a schematic cross-sectional view of an intermediate stage of the method of manufacturing micro devices according to some embodiments of the present disclosure. As shown in FIG. 7, the plasma etching process is continuously performed until the undoped GaN layer 121 is completely removed to expose the n-type GaN layer 124 and the etched GaN-based epitaxial structure 120' is cut into a plurality of micro devices 120". In other words, the etched GaN-based epitaxial structure 120' exposes portions of the metal layer 210. In addition, it is clear that FIGS. 5-7 show the successive stages that continuously perform the plasma etching process once.

In some embodiments, the undoped GaN layer 121 may be completely removed before the etched GaN-based epitaxial structure 120' is cut into a plurality of micro devices 120". In some embodiments, the etched GaN-based epitaxial structure 120' may be cut into a plurality of micro devices 120" before the undoped GaN layer 121 is completely removed.

In some embodiments, a thickness of the n-type GaN layer 124 is greater than a thickness of the p-type GaN layer 122 after the plasma etching process is performed until the undoped GaN layer 121 is completely removed. In this way, the n-type GaN layer 124 can have a sufficient thickness to increase the protection effect on the active layer 123.

Figure 8:
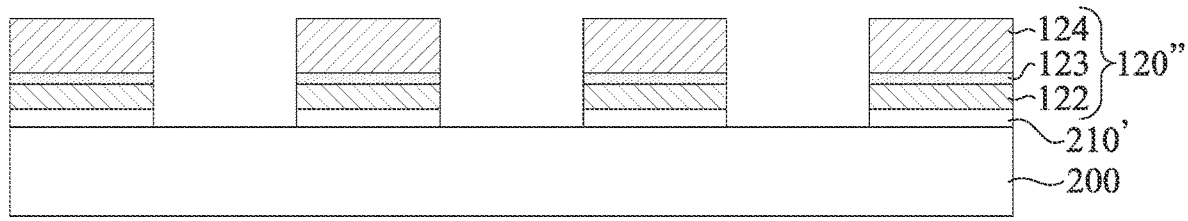
FIG. 8 is a schematic cross-sectional view of an intermediate stage of the method of manufacturing micro devices according to some embodiments of the present disclosure.

Reference is made to FIG. 8. FIG. 8 is a schematic cross-sectional view of an intermediate stage of the method of manufacturing micro devices according to some embodiments of the present disclosure. As shown in FIG. 8, the metal layer 210 is etched into a plurality of metal pads 210' respectively under the micro devices 120".

In some embodiments, a thickness of the metal layer 210 is smaller than 1 μm. In this way, the metal pads 210' formed from the metal layer 210 can be prevented from being polluted too much by etching.

Figure 9:
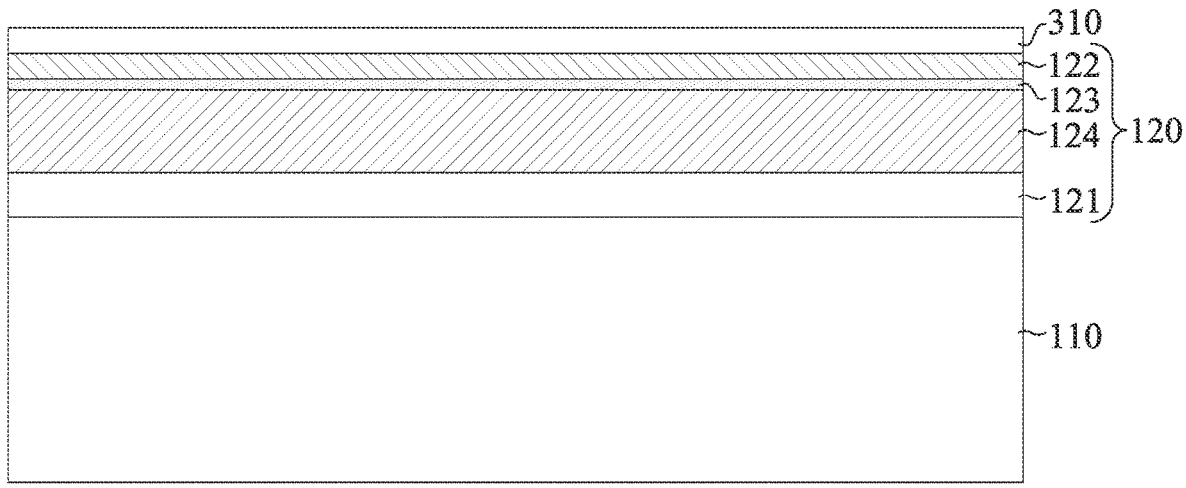
FIG. 9 is a schematic cross-sectional view of an intermediate stage of the method of manufacturing micro devices according to some embodiments of the present disclosure.

Reference is made to FIG. 9. FIG. 9 is a schematic cross-sectional view of an intermediate stage of the method of manufacturing micro devices according to some embodiments of the present disclosure. In some embodiments, the intermediate stage shown in FIG. 1 may be directly followed by the intermediate stage shown in FIG. 9. As shown in FIG. 9, a metal layer 310 is formed on the GaN-based epitaxial structure 120 with the metal layer 310 contacting the p-type GaN layer 122.

Figure 10:
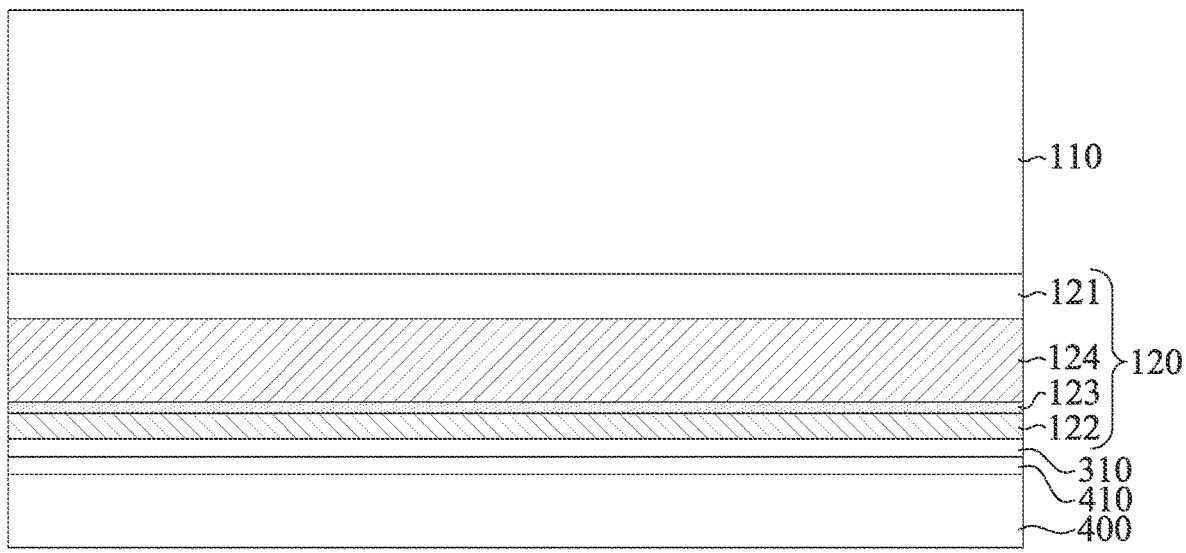
FIG. 10 is a schematic cross-sectional view of an intermediate stage of the method of manufacturing micro devices according to some embodiments of the present disclosure.

Reference is made to FIG. 10. FIG. 10 is a schematic cross-sectional view of an intermediate stage of the method of manufacturing micro devices according to some embodiments of the present disclosure. In some embodiments, the intermediate stage shown in FIG. 9 may be directly followed by the intermediate stage shown in FIG. 10. As shown in FIG. 10, a combination of the metal layer 310, the GaN-based epitaxial structure 120, and the growth substrate 110 is transferred to a substrate 400 with an adhesive layer 410 provided thereon (i.e., the substrate 400 is a carrier substrate), such that the metal layer 310 is in contact with the adhesive layer 410.

Figure 11:
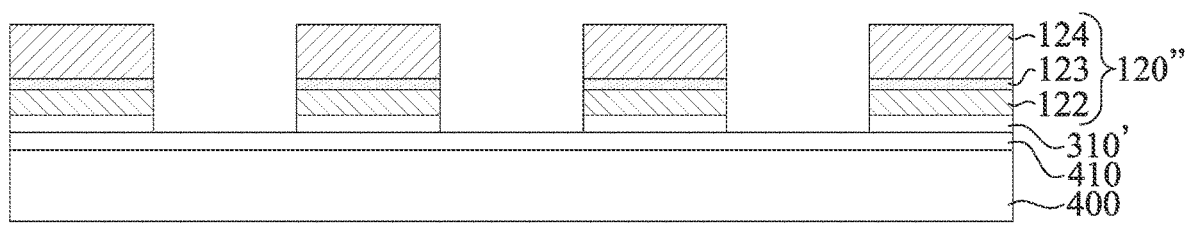
FIG. 11 is a schematic cross-sectional view of an intermediate stage of the method of manufacturing micro devices according to some embodiments of the present disclosure.

Reference is made to FIG. 11. FIG. 11 is a schematic cross-sectional view of an intermediate stage of the method of manufacturing micro devices according to some embodiments of the present disclosure. In some embodiments, the intermediate stage shown in FIG. 10 may be sequentially followed by intermediate stages similar to those shown in FIG. 3, 4, 5, 6 (or 6A), 7, and 8 respectively, such that the intermediate stage shown in FIG. 11 can be obtained. As shown in FIG. 11, the metal layer 310 is etched into a plurality of metal pads 310' respectively under the micro devices 120". It should be pointed out that the micro devices 120" with the metal pads 310' attached thereto may be then massively transferred from the substrate 400 to another substrate (e.g., a receiving substrate).

According to the foregoing recitations of the embodiments of the disclosure, it can be seen that in the method of manufacturing micro devices of the present disclosure, by properly adjusting the thicknesses of the photoresist layer and the GaN-based epitaxial structure and the etch selectivity thereof relative to a plasma etching process, the photoresist layer can be completely removed in the process of manufacturing the micro devices by performing the plasma etching process once. That is, the photoresist layer can be completely removed by the plasma etching process without using any conventional photoresist stripper.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing micro devices, comprising:
preparing a GaN-based epitaxial structure attached on a substrate, the GaN-based epitaxial structure comprising a p-type GaN layer, a n-type GaN layer on the p-type GaN layer, and an undoped GaN layer on the n-type GaN layer;
forming a photoresist layer on the GaN-based epitaxial structure with the undoped GaN layer contacting the photoresist layer;
patterning the photoresist layer to expose portions of the undoped GaN layer;
performing a plasma etching process to the GaN-based epitaxial structure through the patterned photoresist layer until the patterned photoresist layer is completely removed and the undoped GaN layer is patterned, such that a plurality of mesas are formed on the etched GaN-based epitaxial structure, wherein a height of the mesas is at least 1.0 μm; and
continuing to perform the plasma etching process using the patterned undoped GaN layer as an etching mask until the patterned undoped GaN layer is completely removed to expose the n-type GaN layer and the etched GaN-based epitaxial structure is cut into a plurality of micro devices.

2. The method of claim 1, wherein a thickness of the photoresist layer is in a range from 2 μm to 8 μm.

3. The method of claim 1, wherein an etch selectivity of the GaN-based epitaxial structure and the photoresist layer relative to the plasma etching process is in a range from 1.5 to 0.3.

4. The method of claim 3, wherein the etch selectivity is in a range from 1 to 0.5.

5. The method of claim 1, wherein the plasma etching process comprises an ICP-RIE etching process.

6. The method of claim 1, wherein an etching gas used in the plasma etching process comprises at least one of $Cl_2$, $SF_6$, $NF_3$, $Br_2$, $I_2$, and $BCl_3$.

7. The method of claim 6, wherein the etching gas further comprises at least one of Ar, $N_2$, and $O_2$.

8. The method of claim 1, wherein the GaN-based epitaxial structure is attached on the substrate through a metal layer with the p-type GaN layer contacting the metal layer before the forming the photoresist layer, and the continuing to perform the plasma etching process exposes portions of the metal layer.

9. The method of claim 8, wherein the metal layer is fixed to the substrate through an adhesive layer.

10. The method of claim 8, wherein a thickness of the metal layer is smaller than 1 μm.

11. The method of claim 8, further comprising:
etching the metal layer into a plurality of metal pads respectively under the micro devices.

12. The method of claim 1, wherein the height of the mesas is greater than 1.5 μm.

13. The method of claim 1, wherein a height of the micro devices is greater than 1.0 μm.

14. The method of claim 1, wherein a thickness of the n-type GaN layer is greater than a thickness of the p-type GaN layer after the continuing to perform the plasma etching process.

* * * * *